US010096572B2

(12) United States Patent
Shimakawa et al.

(10) Patent No.: US 10,096,572 B2
(45) Date of Patent: Oct. 9, 2018

(54) POWER SEMICONDUCTOR MODULE AND ELECTRIC POWER STEERING APPARATUS USING THE SAME

(71) Applicant: NSK LTD., Tokyo (JP)

(72) Inventors: Shigeru Shimakawa, Tokyo (JP); Takashi Sunaga, Tokyo (JP); Takaaki Sekine, Tokyo (JP)

(73) Assignee: NSK LTD., Tokyo (JP)

( * ) Notice: Subject to any disclaimer, the term of this patent is extended or adjusted under 35 U.S.C. 154(b) by 0 days.

(21) Appl. No.: 15/535,463

(22) PCT Filed: Dec. 2, 2015

(86) PCT No.: PCT/JP2015/083895
§ 371 (c)(1),
(2) Date: Jun. 13, 2017

(87) PCT Pub. No.: WO2016/104088
PCT Pub. Date: Jun. 30, 2016

(65) Prior Publication Data
US 2017/0338201 A1 Nov. 23, 2017

(30) Foreign Application Priority Data
Dec. 24, 2014 (JP) .................................. 2014-260666

(51) Int. Cl.
*H01L 27/00* (2006.01)
*H01L 25/065* (2006.01)
(Continued)

(52) U.S. Cl.
CPC ............ *H01L 25/0655* (2013.01); *B62D 5/04* (2013.01); *H01L 24/48* (2013.01); *H01L 24/49* (2013.01);
(Continued)

(58) Field of Classification Search
CPC ..... H01L 27/00; H01L 25/00; H01L 25/0655; H01L 24/48; H01L 24/49; H01L 23/13;
(Continued)

(56) References Cited

U.S. PATENT DOCUMENTS 4,862,344 A * 8/1989 Emoto .............. H01L 23/49575
257/E23.052
5,043,859 A * 8/1991 Korman ............ H01L 23/49861
174/260
(Continued)

FOREIGN PATENT DOCUMENTS

JP 2004-236470 A 8/2004
JP 4549884 B2 9/2010
(Continued)

OTHER PUBLICATIONS

International Search Report for PCT/JP2015/083895 dated Feb. 2, 2016.

*Primary Examiner* — Bickey Dhakal
(74) *Attorney, Agent, or Firm* — Sughrue Mion, PLLC

(57) ABSTRACT

A power semiconductor module that comprises plural arrangements of power semiconductor elements comprising a power semiconductor bare chip which one electrode portion thereof is connected to a metal plate which at least one external connecting terminal is formed and other external connecting terminals which are electrically connected to other electrode portions of the power semiconductor bare chip, and that are contained in a same package, comprises wherein the power semiconductor elements are basically same outline, electrodes of the bare chip of the power semiconductor elements are mutually connected between the power semiconductor elements with a metal connector or a wiring, and the package is a resin mold package that seals the power semiconductor elements with an electrical insulating resin.

21 Claims, 10 Drawing Sheets

(51) Int. Cl.
  *H01L 23/00*     (2006.01)
  *H02M 7/5387*    (2007.01)
  *H02P 27/08*     (2006.01)
  *H02P 6/28*      (2016.01)
  *B62D 5/04*      (2006.01)
  *H01L 23/50*     (2006.01)
  *H01L 23/14*     (2006.01)
  *H01L 23/13*     (2006.01)

(52) U.S. Cl.
  CPC ........ *H02M 7/53871* (2013.01); *H02P 6/28* (2016.02); *H02P 27/08* (2013.01); *H01L 23/13* (2013.01); *H01L 23/14* (2013.01); *H01L 23/50* (2013.01); *H01L 2224/48137* (2013.01); *H01L 2224/48141* (2013.01); *H01L 2224/48175* (2013.01); *H01L 2224/49111* (2013.01); *H01L 2224/49112* (2013.01); *H01L 2224/49175* (2013.01); *H01L 2924/15724* (2013.01); *H01L 2924/15747* (2013.01)

(58) Field of Classification Search
  CPC ........ H01L 23/14; H01L 23/50; H01L 29/40; H01L 2224/48137; H01L 2224/48141; H01L 2224/481175; H01L 2924/15724; H01L 2224/49111; H05K 1/00
  See application file for complete search history.

(56) References Cited

U.S. PATENT DOCUMENTS

| | | | | |
|---|---|---|---|---|
| 5,438,021 A | * | 8/1995 | Tagawa | H01L 23/49537 257/E23.042 |
| 6,165,820 A | * | 12/2000 | Pace | H01L 23/053 257/E23.079 |
| 6,818,971 B2 | * | 11/2004 | Oda | H01L 23/49575 257/667 |
| 7,138,723 B2 | * | 11/2006 | Aiba | H01L 23/3128 257/737 |
| 7,173,333 B2 | * | 2/2007 | Hata | H01L 23/49562 257/183 |
| 2003/0075796 A1 | * | 4/2003 | Hata | H01L 23/3107 257/734 |
| 2005/0127483 A1 | * | 6/2005 | Joshi | H01L 23/495 257/676 |
| 2005/0280125 A1 | * | 12/2005 | Oliver | H01L 23/49562 257/676 |
| 2006/0151868 A1 | * | 7/2006 | Zhu | H01L 23/3107 257/690 |
| 2007/0267742 A1 | | 11/2007 | Tai | |
| 2008/0251859 A1 | * | 10/2008 | Otremba | H01L 23/49562 257/390 |
| 2011/0250709 A1 | * | 10/2011 | Tachibana | H01L 31/208 438/17 |
| 2013/0032855 A1 | * | 2/2013 | MacHeiner | H01L 23/49524 257/140 |
| 2013/0141871 A1 | * | 6/2013 | Omae | B62D 5/0406 361/709 |
| 2014/0326530 A1 | | 11/2014 | Asao et al. | |
| 2014/0346659 A1 | * | 11/2014 | Nakamura | H02M 7/003 257/704 |
| 2014/0361424 A1 | * | 12/2014 | Horio | H02M 7/003 257/704 |
| 2015/0029672 A1 | | 1/2015 | Nakayama et al. | |

FOREIGN PATENT DOCUMENTS

| | | |
|---|---|---|
| JP | 2011030405 A | 2/2011 |
| JP | 2012248737 A | 12/2012 |
| JP | 2013-151206 A | 8/2013 |
| JP | 2013-187998 A | 9/2013 |
| WO | 2012/060123 A1 | 5/2012 |
| WO | 2012/127696 A1 | 9/2012 |

* cited by examiner

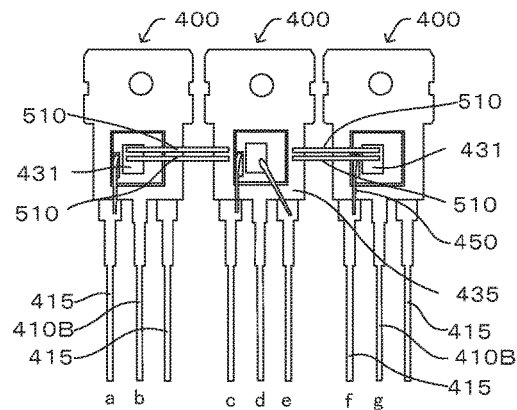
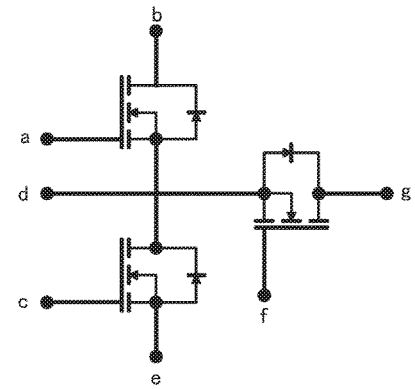
FIG.5A  FIG.5B
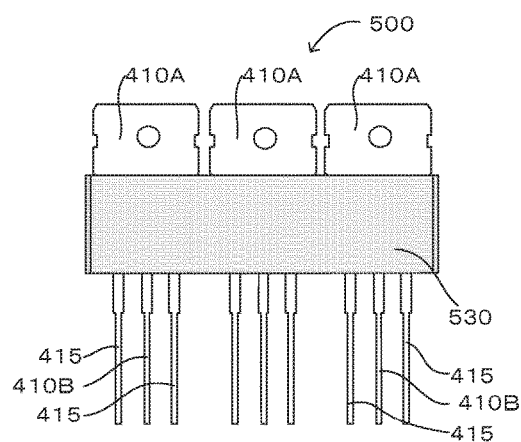
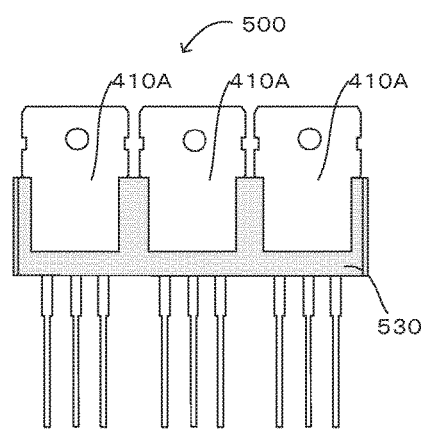
FIG.5C  FIG.5D

POWER SEMICONDUCTOR MODULE AND ELECTRIC POWER STEERING APPARATUS USING THE SAME

CROSS REFERENCE TO RELATED APPLICATIONS

This application is a National Stage of International Application No. PCT/JP2015/083895 filed Dec. 2, 2015, claiming priority based on Japanese Patent Application No. 2014-260666 filed Dec. 24, 2014, the contents of all of which are incorporated herein by reference in their entirety.

TECHNICAL FIELD

The present invention relates to a power semiconductor module that at least two power semiconductors mounted on a metal plate are functionally coupled and are contained in a single package, and to an electric power steering apparatus using the above semiconductor module.

BACKGROUND ART

Conventionally, an electronic circuit that uses a power semiconductor or the like which operates a high electric power, such as an inverter circuit and a power supply circuit may be requested for a furthermore miniaturization corresponding to the miniaturization of equipment that uses such a circuit. It is also necessary that a heat dissipation of the power semiconductor which is mounted with a high-density for the miniaturization is efficiently performed in a low cost.

For example, in a control unit of rotating electrical machines such as a motor that is used to an electric power steering apparatus (EPS) which is used in a vehicle such as a car, the inverter circuit and a relay circuit comprise plural power semiconductors and so on. Accordingly, if these plural power semiconductors are integrated as a single module, it is possible to contribute the miniaturization of the overall electric power steering apparatus (EPS) together with the further miniaturization of the control unit.

On the other hand, as a package that is modularized these plural power semiconductors, for example, technologies that are described in Japanese Patent No. 4549884 B2 (Patent Document 1) and WO 12/127696 A1 (Patent Document 2) are disclosed.

In Patent Document 1, a semiconductor apparatus comprising an electrical conductive heat dissipating substrate; a semiconductor device which is directly disposed on the heat dissipating substrate; plural main electrode plates which each one ends thereof is electrically connected to a main electrode of the semiconductor device; and a resin package which resin-seals the heat dissipating substrate, the semiconductor device, and the plural main electrode plates, wherein external dimensions of the heat dissipating substrate are almost the same as those of the resin package, each the other ends of the plural main electrode plates is exposed to an external at a top surface-side, and the resin package is integral-molded by molding, is described. The surface of the mold package that is opposite to the surface which the semiconductor device is disposed on the electrical conductive heat dissipating substrate is thin molded, and a heat generation from the semiconductor device is heat-dissipated to a heatsink or the like that are attached to an exterior of the semiconductor apparatus via the heat dissipating substrate.

Further, in Patent Document 2, a power semiconductor module comprising plural first metal plates that are arranged on the same surface; power semiconductor chips that are mounted on the plural first metal plates; bridge-shape second metal plates that have bridge-guide sections and leg sections supporting the bridge-guide sections, and appropriately solder-joint between electrodes of the power semiconductor chips, and between the electrodes of the power semiconductor chips and the first metal plates with the leg sections; and a resin package that seals these members by an electrical insulating resin, wherein solder-joint sections of the leg sections are formed over a surface by a bending, and provided a position which are lower than the bridge-guide sections, is described.

THE LIST OF PRIOR ART DOCUMENTS

Patent Documents

Patent Document 1: Japanese Patent No. 2004-161118 B2
Patent Document 2: WO 2012/127696

SUMMARY OF THE INVENTION

Problems to be Solved by the Invention

However, in the semiconductor apparatus described in Patent Document 1, the plural main electrode plates (external connecting electrode plates) and the heat dissipating plate are individually disposed and are joined by solder or the like. Thus, an additional area in order to join such individual elements is needed, an area of the module is larger for needed solder-joint area, and then the miniaturization is inhibited. When configuring to the inverter circuit and so on, it is necessary to implement circuit wirings on the module-side substrate. As a result, the miniaturization of the module is inhibited.

Further, in the semiconductor apparatus described in the above Patent Document 1, plural aluminum wirings WR are electrically connected from the device to an external connecting electrode plate. However, in a case of adopting such a structure, a limitation in a process exists. Since the plural wirings need to be implemented, there is a problem in reliability.

Furthermore, in the semiconductor module described in the above Patent Document 2 which is different from that of the above Patent Document 1, power semiconductor chips which are not packaged is mounted on plural first metal plates, and are electrically connected to the bridge-shape second metal plates, and the overall is sealed by a resin package. Therefore, in the semiconductor module that is described in the above Patent Document 2, because the above first metal plates and the above second metal plates individually need to be formed, a cost is high. Further, since it is necessary to join the second metal plate to another second metal plate, there is a problem that the reliability decreases in the processing, and an increase in the cost is arisen. In the semiconductor module described in the Patent Document 2, because the above semiconductor chips are mounted on the plural first metal plate, and contained in one package, a miniaturization is possible. However, in comparison to the number of semiconductors that configures the semiconductor module, since the area that enables to use the heat dissipation of the first metal plates on which the semiconductor chips are directly mounted, relatively decreases, the problem that the sufficient heat dissipation is not performed, is existed.

The present invention is intended to resolve the above problems existing in the conventional technology, and an object of the present invention is to provide a low cost and a high reliability power semiconductor module that is internal-connected to the needed power semiconductor elements, and achieves a miniaturization, an improvement in the heat dissipation, a decrease in an internal resistance or the like by using the plural power semiconductor elements comprising general purpose components.

Means for Solving the Problems

In order to resolve the above problems, the present invention relates to provide a power semiconductor module that comprises plural arrangements of power semiconductor elements comprising a power semiconductor bare chip which one electrode portion thereof is connected to a metal plate which at least one external connecting terminal is formed and other external connecting terminals which are electrically connected to other electrode portions of the power semiconductor bare chip, and that is formed by being contained in a same package, comprising: wherein the power semiconductor elements are basically same outline, electrodes of the bare chip of the power semiconductor elements are mutually connected between the power semiconductor elements with a metal connector or a wiring, and the package is a resin mold package that seals the power semiconductor elements with an electrical insulating resin.

The resolution of the above problems are more efficiently achieved by that: wherein the power semiconductor bare chip is a bare chip of a field effect transistor, a drain electrode of the bare chip is joined to a metal plate that the one external connecting terminal is formed, a gate electrode and a source electrode of the bare chip are provided with a spaced side from the one external connecting terminal against the drain electrode, and a portion of the gate electrode or the source electrode is mutually connected between the power semiconductor elements with the metal connector or the wiring; or wherein the one external connecting terminal and the other external connecting terminals are mutually arranged in parallel.

Further, the resolution of the above problems are more efficiently achieved by that: wherein the plural arrangements are arranged in parallel to at least two of the power semiconductor elements on a flat surface; or wherein the plural arrangements are arranged in parallel to at least two of the power semiconductor elements along a virtual curved surface; or wherein the virtual curved surface is a side surface of a cylinder and the external connecting terminals which are mutually arranged in parallel are parallel to a direction of a main axis of the cylinder; or wherein the plural arrangements are arranged in parallel to at least two of the power semiconductor elements along respective side-surfaces of a polygonal column which is constituted by a virtual polygon, and the external connecting terminals which are mutually arranged in parallel are parallel to a direction of a main axis of the polygonal column.

Furthermore, the resolution of the above problems are more efficiently achieved by that: wherein a material of the metal plate is copper or aluminum; or wherein the metal plate has an exposed portion to be exposed from the package inside to an exterior and the exposed portion is connectable to a heat dissipating member which is disposed to the exterior.

In order to resolve the above problems, the present invention provides with a control unit that, in driving a three-phase brushless motor, uses the power semiconductor module which is formed by three power semiconductor elements which control each one phase and are contained in a same package.

In order to resolve the above problems, the present invention provides with an electric power steering apparatus that uses the above power semiconductor module.

Effects of the Invention

In the present invention, by using the plural power semiconductor elements (for example, two or three) which are easily available to obtain as mainly general purpose components, the plural power semiconductor elements are mutually arranged in parallel on a flat surface or a curved surface. The external connecting terminals (leads) that configure the power semiconductor element basically use the general purpose components as they are. However, in a portion of the external connecting terminals (leads) which a large current passes, the present invention adopts a configuration that a wiring resistance and a heat generation decrease by partially connecting between the semiconductor bare chips, which configure the power semiconductor elements, by means of a clip or wiring, and further integral-molds the plural power semiconductor elements with a resin package.

Thus, in a case that the semiconductor module according to the present invention which comprises the plural integrated power semiconductor elements are used for, for example, an inverter control of a three-phase induction motor, it is possible to use by combining three FETs (an upper arm section, a lower arm section, and a motor relay section) which are normally used to control one phase as one set. By using such a manner, effects of low cost (use of the general purpose components), a miniaturization (space-saving), a wiring-saving (an effect directly connecting between the power semiconductor chips), a heat generation countermeasure (three FETs are not switched-ON at the same time (one FET is surely switched-OFF)) and so on are possible to be obtained.

Further, by constituting one-package semiconductor module by the plural power semiconductors which are used to control a power supply of the electric motor or the like, a similar effect can be also obtained.

BRIEF DESCRIPTION OF THE DRAWINGS

In the accompanying drawings:

FIG. 5A is a front view illustrating an example of a power semiconductor module of the present invention which does not include a package portion;

FIG. 5B is a circuit diagram of the example of FIG. 5A;

FIG. 5C is a front view of the example of FIG. 5A;

FIG. 5D is a back view of the example of FIG. 5A;

MODE FOR CARRYING OUT THE INVENTION

Considering a control unit of an electric motor (hereinafter, merely refer to "motor") that is used in an electric power steering apparatus (EPS) or the like of a vehicle as a configuration example of a power semiconductor module of the present invention, embodiments according to the present invention will be described.

Here, the electric power steering apparatus provides a steering system of a vehicle with a steering assist torque (an assist torque) by means of a rotational torque of the motor. Then, the electric power steering apparatus applies the steering assist torque to a steering shaft or a rack shaft by means of a transmission mechanism such as gears or a belt through a reduction mechanism by using a driven force of the motor controlled by electrical power which is supplied from the power supply section (an inverter). In order to accurately generate the assist torque, such the electric power steering apparatus performs a feedback control of a motor current.

The feedback control adjusts a voltage supplied to the motor so that a difference between a steering assist command value (a current command value) and a detected motor current value becomes small, and the adjustment of the voltage applied to the motor is generally performed by an adjustment of a duty of a pulse width modulation (PWM) control.

Figure 1:
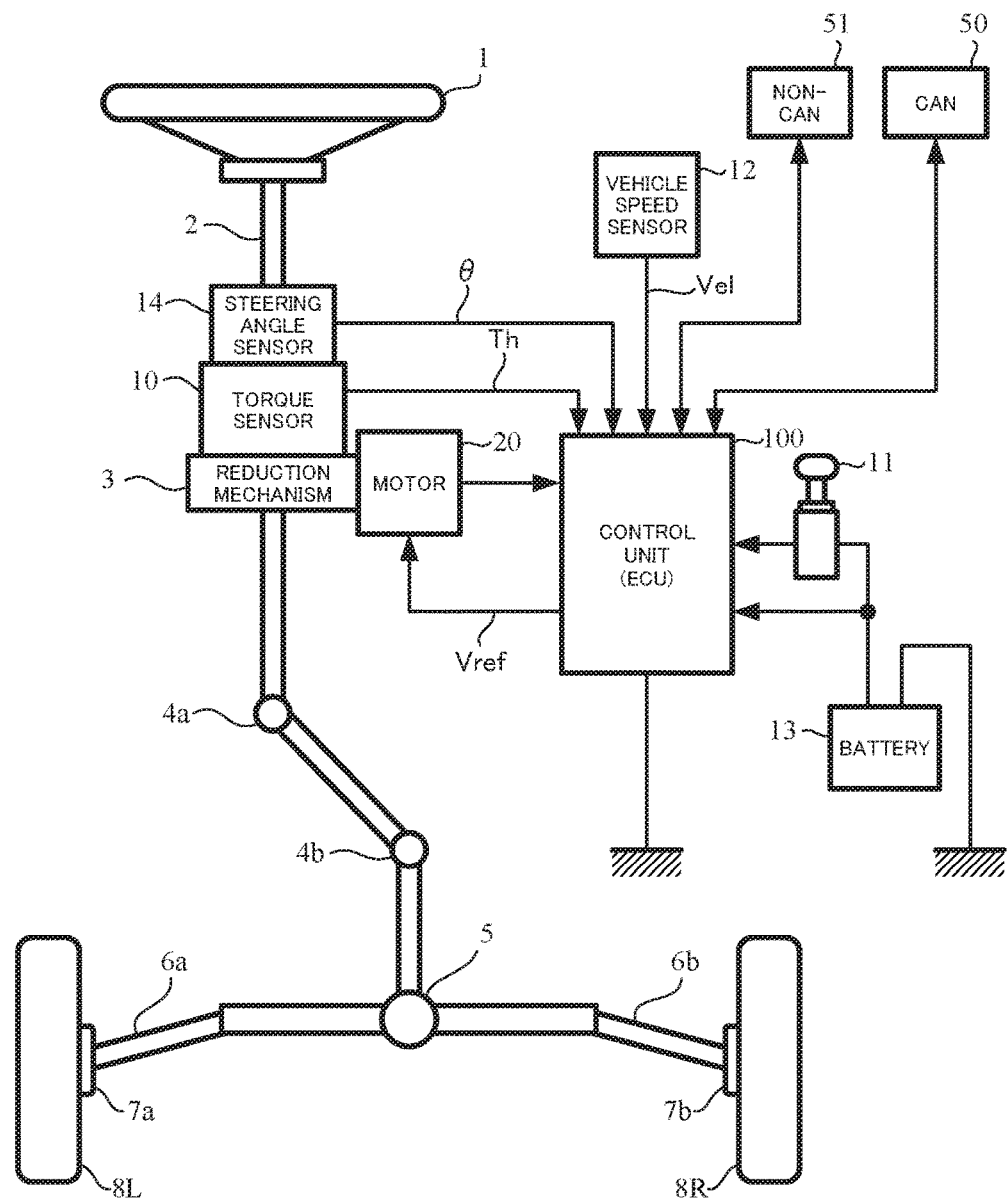
FIG. 1 is a configuration diagram illustrating a general outline of an electric power steering apparatus.

A general configuration of the electric power steering apparatus will be described with reference to FIG. 1. As shown in FIG. 1, a column shaft (a steering shaft or a handle shaft) 2 connected to a steering wheel (handle) 1 is connected to steered wheels 8L and 8R through reduction gears 3, universal joints 4a and 4b, a rack-and-pinion mechanism 5, and tie rods 6a and 6b, further via hub units 7a and 7b. In addition, the column shaft 2 is provided with a torque sensor 10 for detecting a steering torque Th of the steering wheel 1 and a steering angle sensor 14 for detecting a steering angle θ, and a motor 20 for assisting a steering force of the steering wheel 1 is connected to the column shaft 2 through the reduction gears 3 (a gear ratio "n").

The electric power is supplied to a control unit (ECU) 100 for controlling the electric power steering apparatus from a battery 13, and an ignition key signal is inputted into the control unit 100 through an ignition key 11.

Such a control unit 100 calculates a current command value of an assist (a steering assist) command on the basis of the steering torque Th detected by the torque sensor 10 and a vehicle speed Vel detected by a vehicle speed sensor 12, and controls a current supplied to the motor 20 by means of a voltage control command value Vref obtained by performing a compensation or the like for the calculated current command value. The steering angle sensor 14 is not indispensable and may not be provided. It is possible to obtain the steering angle from a rotational position sensor such as a resolver which is connected to the motor 20.

A controller area network (CAN) 50 to send/receive various information and signals on the vehicle is connected to the control unit 100, and it is also possible to receive the vehicle speed Vel from the CAN 50. Further, a Non-CAN 51 that sends and receives a communication, analogue/digital signals, electric wave or the like except for the CAN 50 is also connected to the control unit 100.

Figure 2:
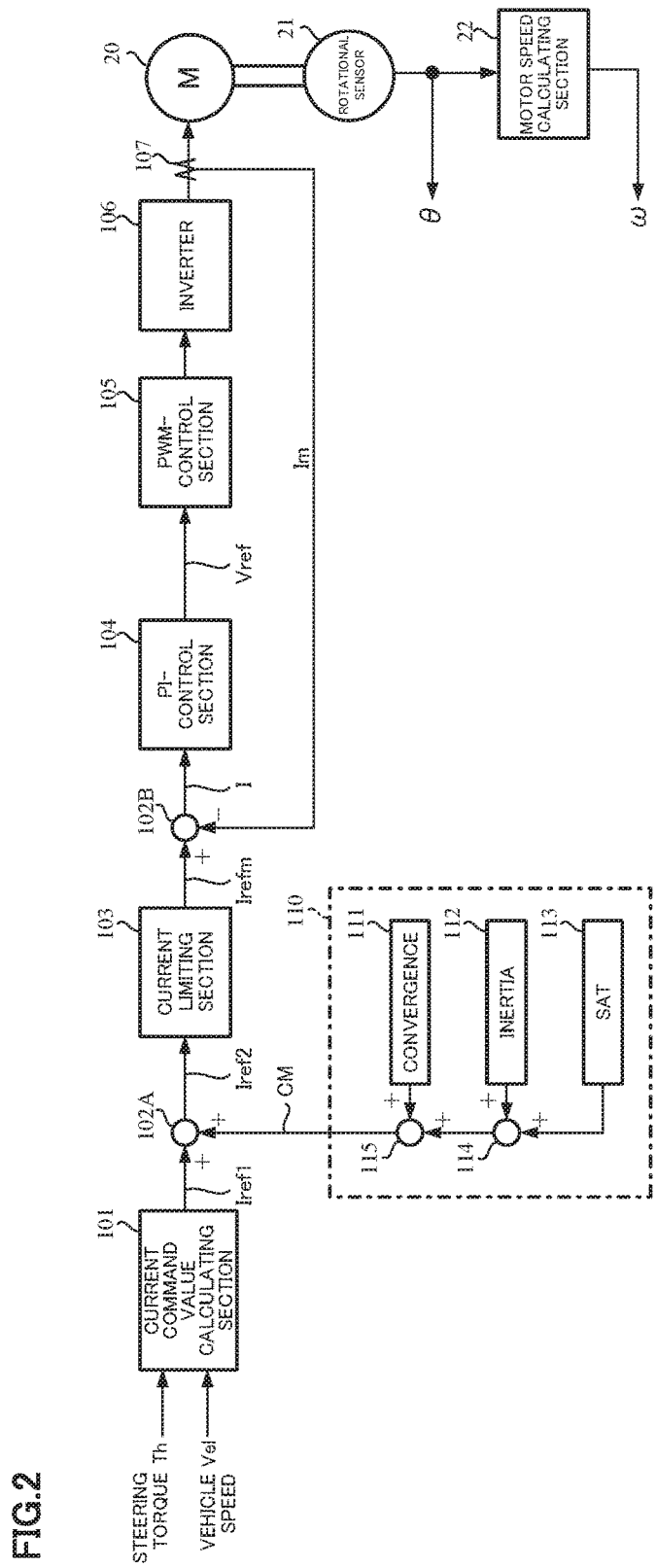
FIG. 2 is a block diagram showing a general configuration example of a control unit (ECU) of the electric power steering apparatus.

The control unit 100 mainly comprises a CPU (Central Processing Unit) (including an MPU (Micro Processor Unit) and an MCU (Micro Controller Unit)), and general functions performed by programs within the CPU are, for example, shown in FIG. 2.

The control unit 100 will be described with reference to FIG. 2. As shown in FIG. 2, the steering torque Th detected by the torque sensor 10 and the vehicle speed Vel detected by the vehicle speed sensor 12 (or from the CAN 50) are inputted into a current command value calculating section 101 which calculates a current command value Iref1. The current command value calculating section 101 calculates the current command value Iref1, based on the steering torque Th and the vehicle speed Vel with reference to an assist map or the like, which is a control target value of a current supplied to the motor 20. The calculated current command value Iref1 is inputted into a current limiting section 103 via an adding section 102A, and the current command value Irefm that is limited the maximum current in the current limiting section 103, is feedback-inputted into a subtracting section 102B. A deviation I (=Irefm−Im) between the current command value Irefm and a motor current value Im is calculated at the subtracting section 102B, and the deviation I is inputted into a PI-control section 104 for improving a current characteristic of the steering operation. The voltage control command value Vref that the characteristic is improved in the PI-control section 104, is inputted into a PWM-control section 105, and the motor 20 is PWM-driven through an inverter 106. The motor current value Im of the motor 20 is detected by a motor current detector 107 and is fed-back to the subtracting section 102B. The inverter 106 is constituted by a bridge circuit of the FETs as a driving element.

The rotational sensor 21 such as the resolver is connected to the motor 20, the motor rotational angle θ is outputted from the rotational sensor 21, and a motor speed ω is calculated at a motor speed calculating section 22.

A compensation signal CM from a compensation signal generating section 110 is added at the adding section 102A. A characteristic compensation of the steering system is performed by adding the compensation signal CM, and then a convergence, an inertia property and so on are improved. The compensation signal generating section 110 adds a self-aligning torque (SAT) 113 with an inertia 112 at an adding section 114, further adds the result of addition performed at the adding section 114 with a convergence 111 at an adding section 115, and then outputs the result of addition performed at the adding section 115 as the compensation signal CM.

Figure 3:
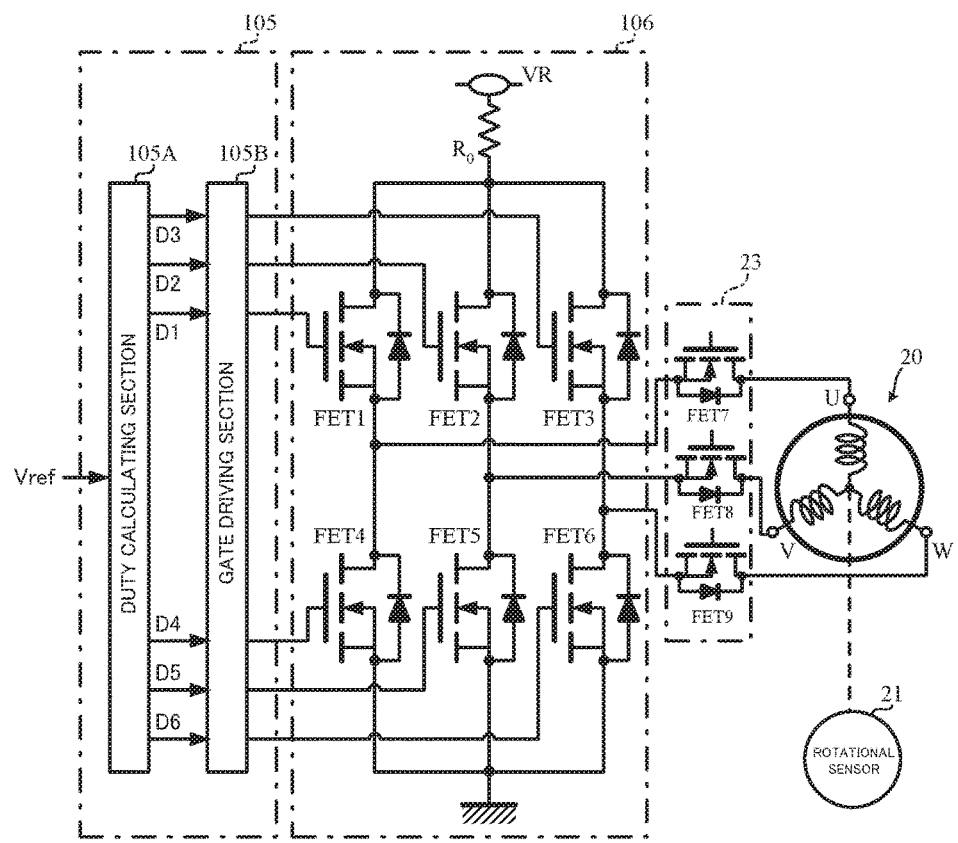
FIG. 3 is a wiring diagram illustrating a configuration example of a motor control section of the electric power steering apparatus.

In a case that the motor 20 is a three-phase brushless motor, details of the PWM-control section 105 and the inverter 106, for example, have a configuration as shown in FIG. 3. The PWM-control section 105 comprises a duty calculating section 105A to calculate three-phase PWM-duty values D1 to D6 in accordance with a predetermined equation by using the voltage control command value Vref, and a gate driving section 105B to drive gates of FETs serving as driving devices of the PWM-duty values D1 to D6 and switch-ON or switch-OFF for compensating a dead time. The inverter 106 comprises three-phase bridges of the FETs (FET1 to FET6) serving as semiconductor switching devices, and drives the motor 20 by switching-ON or switching-OFF the FETs using the PWM-duty values D1 to D6. Power supply lines between the inverter 106 and the motor 20 are connected to a motor relay 23 that comprises motor release switches to supply (ON) or block (OFF) the electric power. FIG. 3 shows an example that two-phase power supply of three-phase is switched-ON or switched-OFF by the motor relay 23 which uses semiconductor switching devices (for example, FET7 to FET9) serving as the motor release switches.

In the above electric power steering apparatus, a semiconductor module of the present invention that is used in the above control unit 100 has a following configuration. In a following description, the same components which can adopt other modes will be assigned the same reference numerals, and overlapping descriptions and configurations will not be partially described below.

The power semiconductor module of the present invention functionally connects two or more power semiconductor elements and is contained in one package. Then, at first, the above power semiconductor element will be appropriately described with reference to the drawings.

Figure 4A:
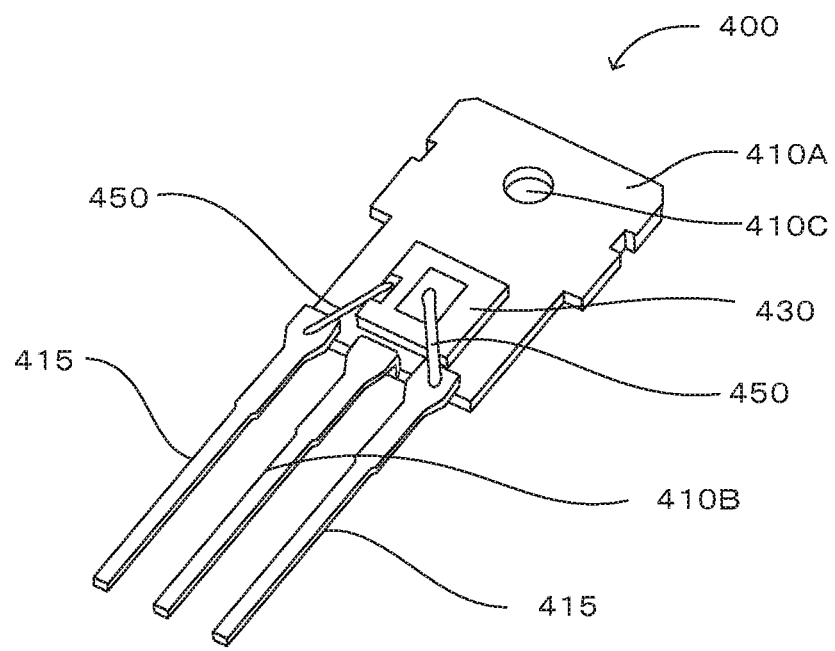
FIG. 4A is a perspective view illustrating an overall structure of an example of a power semiconductor element of the present invention.
Figure 4B:
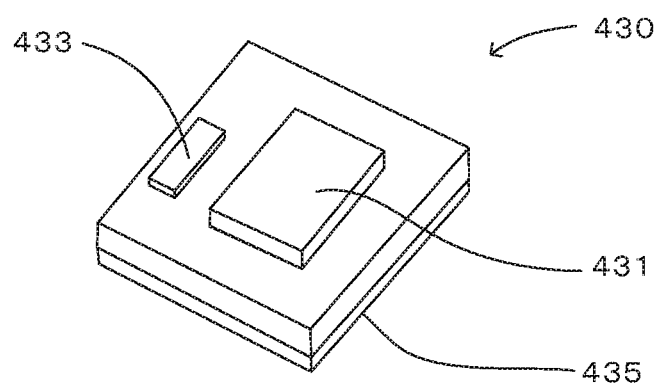
FIG. 4B is a perspective view illustrating a configuration example of an FET.

FIG. 4A and FIG. 4B show an electronic part that is used in a "TO-220" package, as an example of the power semiconductor element constituting the present invention. FIG. 4A is a perspective view of the power semiconductor element, and FIG. 4B is a perspective view illustrating the FET in a case that the field effect transistor (FET) is used as an example of a bare chip that is configured to the power semiconductor element.

The power semiconductor element 400 according to the present invention comprises, as basic configuration elements, a metal plate 410 which one external connecting terminal 410B is formed, other external connecting terminals 415, a power semiconductor bare chip 430 and wirings 450.

In the above power semiconductor element 400, the metal plate 410 which the one external connecting terminal 410B is formed, comprises a metal plate portion 410A to mount the power semiconductor bare chip 430 and the one external connecting terminal 410B. The metal plate portion 410A is formed by a rectangular plate made of a metal such as copper or aluminum, and the power semiconductor bare chip 430 is mounted on one surface side of the metal plate. Further, in this embodiment, a bore 410C to enable to fix the metal plate portion 410A to an external equipment or the like such as a substrate, is provided. As well, when packaging by using a resin member on the metal plate portion 410A, by being exposed a part of the metal plate portion 410A to an exterior, it is also possible to utilize the exposed portion as an electrode to connect the external equipment or the like, and a heat dissipation plate for the heat dissipation. It is further possible to fix the metal plate portion 410A to the heat sink or the like which is provided with the exterior via a bolt and so on in the bore 410C.

Further, the one external connecting terminal section (it is also referred to as an "external connecting terminal") 410B is integrally configured to the metal plate portion 410A, is a smaller elongated rectangular plate than the above metal plate portion 410A, is slightly shifted to the power semiconductor bare chip 430, and is formed in parallel to the metal plate portion 410A. Then, the one external connecting terminal section 410B has a function as a connecting terminal to electrically connect the external equipment or a device to a portion of the bare chip via the substrate after packaging the power module of the present invention by the resin member.

Furthermore, the other external connecting terminals 415 in the power semiconductor element 400 are connected to the other electrodes in the electrodes of the semiconductor bare chip 430 which are not connected to the metal plate 410, and have a function as a connecting terminal to electrically connect the other electrodes to the external equipment or the device or the like via the substrate and so on.

Therefore, the external connecting terminals 415 needs plural ones depending on the number of electrodes which vary due to the kind of the connected semiconductor bare chip 430. In a case of this embodiment, the FET that has three electrodes is used as the semiconductor bare chip 430. Since one of the three electrodes is connected to the metal plate portion 410A, the number of the external connecting terminals 415 is two. Although the shape of the external connecting terminals 415 is not especially limited, in this embodiment, a basic shape of the external connecting terminals 415 is an elongated rectangular shape that is almost the same as the external connecting terminal section 410B which is formed on the metal plate 410. The long side of the elongated rectangular external connecting terminal section 410B is mutually arranged in parallel to those of the external connecting terminal sections 415.

Because the external connecting terminals 415 are electrical insulated to the metal plate 410 and configurations of the external connecting terminals 415 are separated to that of the metal plate 410, when packaging, the external connecting terminals 415 are arranged in parallel to the external connecting terminal 410B which is formed on the metal plate 410, and are slightly shifted to a direction of the power semiconductor rather than a plane formed on the metal plate 410.

Further, the power semiconductor bare chip 430 in the power semiconductor element 400, as shown in a perspective view of FIG. 4B, has a quadrangular configuration as an overall, and is mounted on one surface side of the metal plate 410, as above described. In this embodiment, the power semiconductor bare chip 430 is the FET, a drain electrode 435 of the FET is disposed on a lower surface of the power semiconductor bare chip 430, and a source electrode 431 and a gate electrode 433 are disposed on an upper position of the drain electrode 435. Then, in a case that the power semiconductor bare chip 430 is mounted on the metal plate 410 from the drain electrode 435, the source electrode 431 and the gate electrode 433 are spaced from the metal plate 410.

Basically, the source electrode 431 and the gate source 433 are in electrical connected to the external connecting terminals 415 via the wirings 450. In the semiconductor module of the present invention, when the plural power semiconductor elements 400 are functionally disposed, as mentioned below, there is a possibility that the electrode of the FETs is electrically connected to the corresponding electrode of the FETs by using a metal connector (clip) 510 or the wiring 450.

Although the power semiconductor element 400 according to the present invention, for example, has an above configuration, the configuration is not limited to use the above exemplified "TO-220 package". Thus, in accordance with an aspect of the present invention, even though a configuration element of the power semiconductor which is used inside a single power semiconductor package is a general purpose component or the like, it is possible to use the power semiconductor module of the present invention.

Next, the power semiconductor module of the present invention which the plural power semiconductor elements are functionally integrated will be described with reference to the drawings, appropriately.

FIGS. 5A to 5D and FIGS. 6A to 6B illustrate examples of an embodiment 500 which the above three power semiconductor elements 400 are assembled, are functionally coupled to a single package, and are completed as the power semiconductor module.

Figures 6A, 6B:
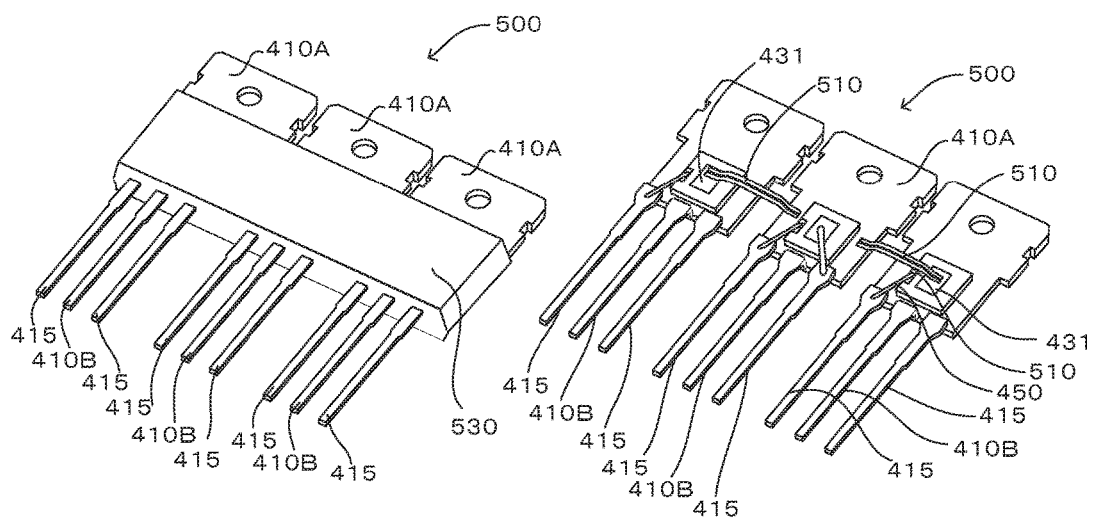
FIG. 6A is a perspective view illustrating an overall structure of the example of the power semiconductor module of the present invention.
FIG. 6B is a perspective view of the example of FIG. 6A which does not include the package portion.

In FIG. 5A to FIG. 5D, FIG. 5A is a front view illustrating an example of the power semiconductor module which does not include a package portion, FIG. 5B is a circuit diagram, FIG. 5C is a front view, and FIG. 5D is a back view. In FIG. 6A and FIG. 6B, FIG. 6A is a perspective view illustrating an overall structure of the example of the power semiconductor module, and FIG. 6B is a perspective view of the example of FIG. 6A which does not include the package portion.

In the embodiment 500 of the present invention, as shown in FIG. 5A, the above three power semiconductor elements 400 are arranged in parallel on a flat surface, and these power semiconductor elements 400 are mutually connected via metal connectors (clips) 510 or wirings 450. Here, the clips 510 are made of a metal such as copper or aluminum. Then, the clips 510 uses one electrical conductor line, which has the same cross-sectional area which the wiring 450 is used in the power semiconductor element 400 or a larger cross-sectional area than that of the wiring 450, or plural electrical conductor lines as shown in FIG. 5A. Decreasing of a wiring resistance is realized in comparison to a case of using only the wiring 450.

As shown in FIG. 5A, the clips 510 or the wirings 450 electrically connect a source electrode 431 of a power semiconductor 430 of a left power semiconductor element 400 to a gate electrode 435 of a power semiconductor 430 of a center power semiconductor element 400 via a metal plate portion 410A of the center power semiconductor element 400, and further electrically connect the metal plate portion 410A of the center power semiconductor element 400 to a source electrode 431 of a power semiconductor 430 of a right power semiconductor element 400. Then, the three power semiconductor elements are functionally integrated.

FIG. 5B shows a connecting relationship of the power semiconductors 430 via the clips 510 or the wirings 450 in the power semiconductor elements 400. In FIG. 5B, the symbols "a" to "g" are corresponding to the external connecting terminals "a" to "g" (410B and 415) of the power semiconductor elements 400 as shown in FIG. 5A. In the external connecting terminals (410B and 415) of the power semiconductor elements 400 as shown in FIG. 5A, although the right external connecting terminals of the left and right power semiconductor elements 400 do not have a symbol, these external connecting terminals are not electrically connected by the connection among the power semiconductor elements 400 via the clips 510 or the wirings 450. Consequently, it is possible that these external connecting terminals do not include the configuration of the above power semiconductor unit.

Hence, according to the power semiconductor unit of the present invention, when the plural power semiconductor elements 400 are assembled and are functionally integrated, it is possible that the power semiconductor elements 400 utilize more limited than the configuration element of the power semiconductor which is used in a single power semiconductor package inside, thereby the decreasing of a cost can be realized.

As well, in a case of the above embodiment 500, the power semiconductor elements that include the external connecting terminals 415 which do not have an electrically connection, are integrated in one package. Even in the above case, improvements of the miniaturization and the heat dissipation are realized.

Further, a front view and a back view illustrated in FIG. 5C and FIG. 5D show a state that the three power semiconductor elements 400 which are connected as shown in FIG. 5A are sealed with an electrical insulating resin 530.

The above electrical insulating resin 530 fixes the respective electronic parts which configure the power semiconductor elements 400, insulates spaces between the configuration elements and core portions of the configuration elements from the external, and conducts the heat from the respective electronic parts to outside.

In this way, the electrical insulating resin 530 seals a portion of mounting the power semiconductor bare chip 430 of the metal plate portion 410A, a portion which is connected by the clips 510 or the wirings 450, a portion that the external connecting terminal 410B extends from the metal plate portion 410A, and a portion near the metal plate portion 410A of the external connecting terminals 415 in the power semiconductor element 400 by a resin mold package.

However, as described above, a portion of the external connecting terminals (410B and 415) which are opposite to the metal plate portions 410A, is exposed from the resin mold package in order to electrically connect to the external equipment or the like. Similarly, in the metal plate portions 410A, a portion of the bore 410C side which is opposite to the external connecting terminals (410B and 415), is exposed from the resin mold package.

Further, in the above embodiment 500, a surface of the metal plate portion 410A that is opposite to the surface which the power semiconductor 430 is mounted, is exposed from the resin mold package. The exposed portion is attached in contact with a heat sink or the like which is disposed adjacent to the power semiconductor module of the present invention. Thereby, it is possible to improve the heat dissipation.

Although a material of the electrical insulating resin 530 is not especially limited, it is preferred to use an elastomer which has a high electrical insulation and a high heat conductivity.

In the embodiment 500 of the present invention which has the above configuration, since the power semiconductor elements 400 are functionally coupled and are combined, it is possible to miniaturize the configuration, simplify the inside wirings, improve the heat dissipation, and take the above measures in the low cost.

Furthermore, in the present invention, as described above, it is possible to form one power semiconductor module by integrating the three power semiconductors 430 comprising the FETs, and these are applicable to the following embodiments 900 and 1000. Then, the above-mentioned control unit 100 of the electric power steering apparatus can use this module.

Accordingly, for example, in the inverter 106 and the motor relay 23 of the control unit 100 as shown in FIG. 3, it is possible to use the three-phase motor control by forming one module with the FETs which are used to one phase control in the three phases (U-phase, V-phase and W-phase) of the motor 20, and integrating the three power semiconductor module of the present invention.

In this connection, for example, as shown in FIG. 3, one phase corresponding to the U-phase of the motor 20 which comprises an FET1 of an upper arm section, an FET4 of a lower arm section, and an FET7 of the motor relay section 23 can be formed by the power semiconductor module of the present invention. Other two phases (V-phase and W-phase) are adopted by the same configuration. It is possible to realize the further miniaturization and the improvement of the heat dissipation of the control unit 100 in the above electric power steering apparatus.

Next, an example of an embodiment 700 which the two power semiconductor elements 400 are assembled, are functionally coupled to a single package, and are completed as the power semiconductor module, will be described with reference to FIG. 7A to FIG. 7D and FIG. 8A to FIG. 8B.

Figure 7A:
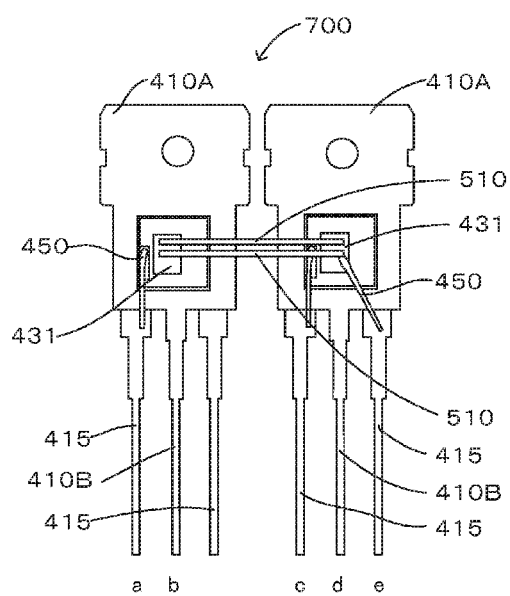
FIG. 7A is a front view illustrating another example of the power semiconductor module of the present invention which does not include the package portion.
Figure 7B:
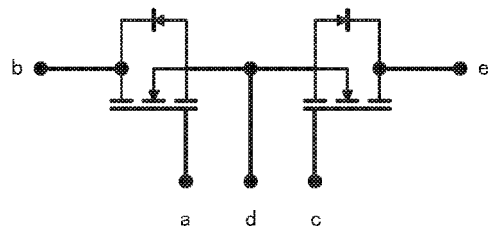
FIG. 7B is a circuit diagram of the example of FIG. 7A.
Figure 7C:
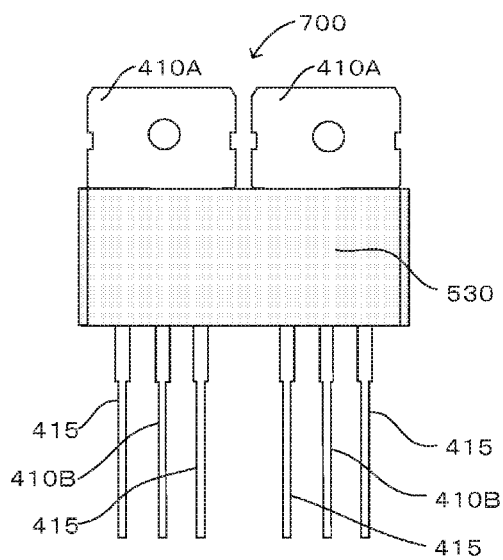
FIG. 7C is a front view of the example of FIG. 7A.
Figure 7D:
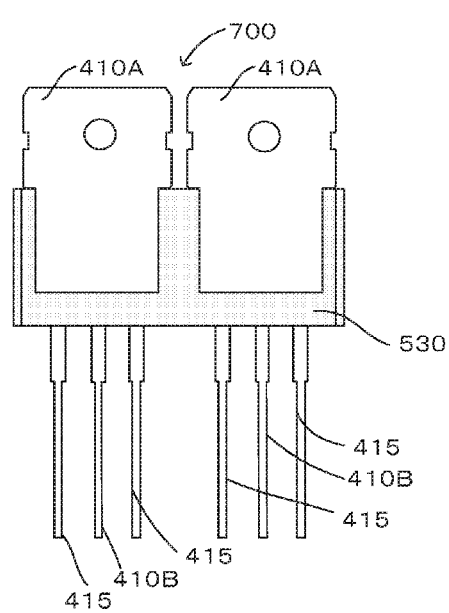
FIG. 7D is a back view of the example of FIG. 7A.
Figures 8A, 8B:
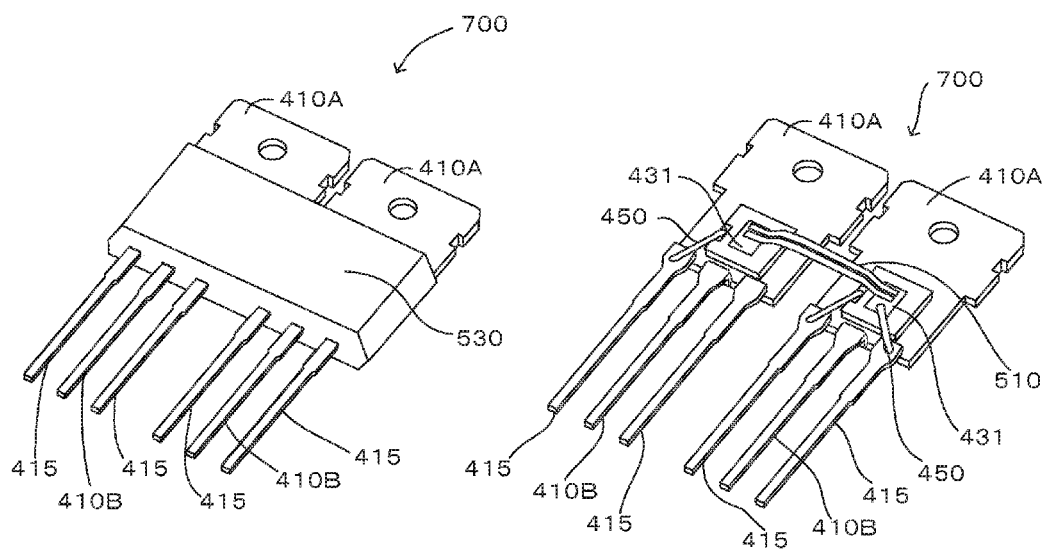
FIG. 8A is a perspective view illustrating an overall structure of the example of the power semiconductor module of the present invention.
FIG. 8B is a perspective view of the example of FIG. 8A which does not include the package portion.

Here, the embodiment 700 of the present invention is illustrated in FIG. 7A to FIG. 7D and FIG. 8A to FIG. 8B. In FIG. 7A to FIG. 7D, FIG. 7A is a front view illustrating an example of the power semiconductor module which does not include a package portion, FIG. 7B is a circuit diagram, FIG. 7C is a front view, and FIG. 7D is a back view. In FIG. 8A and FIG. 8B, FIG. 8A is a perspective view illustrating an overall structure of the example of the power semiconductor module, and FIG. 8B is a perspective view of the example of FIG. 8A which does not include the package portion.

The above embodiment 700 of the present invention is basically the same configuration as the above embodiment 500. However, a difference between the embodiment 500 and the embodiment 700 is that the two power semiconductor elements 400 are used in the embodiment 700.

Consequently, as shown in FIG. 7A, a source electrode 431 of the power semiconductor 430 of a left power semiconductor element 400 is electrically connected to a source electrode 431 of the power semiconductor 430 of a right power semiconductor element 400, and the above two power semiconductor elements 400 are functionally integrated.

FIG. 7B shows a connecting relationship of the power semiconductors 430 via the clips 510 or the wirings 450 in the power semiconductor elements 400, as shown in FIG. 7A. In FIG. 7B, the symbols "a" to "e" are corresponding to the external connecting terminals "a" to "e" (410B and 415) of the power semiconductor elements 400 as shown in FIG. 7A. In the external connecting terminals (410B and 415) of the power semiconductor elements 400 as shown in FIG. 7A, although the right external connecting terminal of the left power semiconductor element 400 does not have a symbol, this external connecting terminal is not electrically connected by the connection between the power semiconductor elements 400 via the clips 510 or the wirings 450.

In the embodiment 700 of the present invention which has the configuration as well as the above embodiment 500, since the above power semiconductor elements 400 are functionally coupled and are combined, it is possible to miniaturize the configuration, simplify the inside wirings, improve the heat dissipation, and take the above measures in the low cost.

In a case that the semiconductor module of the embodiment 700 of the present invention which has the above configuration is used to the electric power steering apparatus, since the two power semiconductors may be used to a control of a power supply side in the electric power steering apparatus, it is possible to further miniaturize by obtaining the one module with a combination of the two power semiconductors.

Next, an example that plural power semiconductor elements 400 are assembled and are arranged along a virtual curved surface or the like, not a flat surface, will be described.

Figure 9:
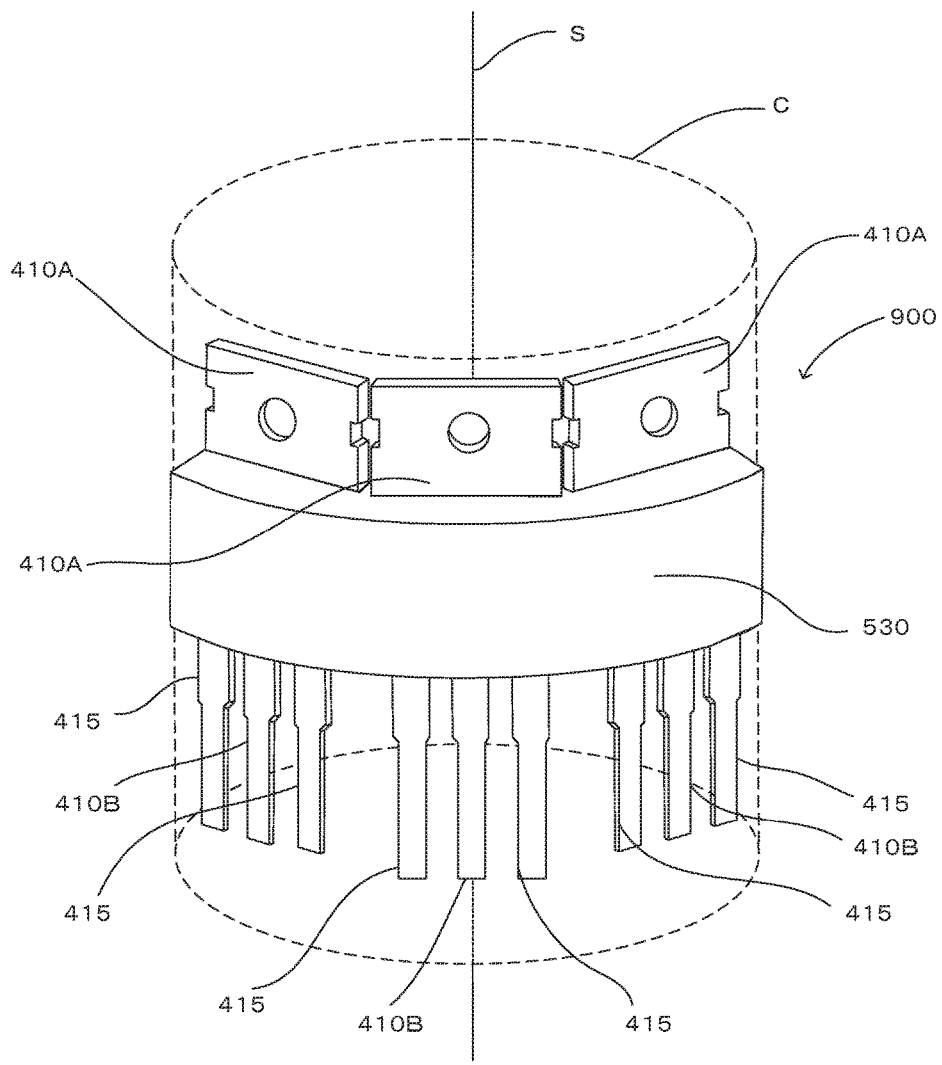
FIG. 9 is a perspective view illustrating still another example of the power semiconductor module of the present invention.

FIG. 9 is a perspective view illustrating an example of the embodiment 900 of the present invention which the three power semiconductor elements 400 are arranged in parallel along the virtual curved surface. Especially, the example which the above virtual curved surface is a side surface of a cylinder C is illustrated.

As well, in the above embodiment 900, because the power semiconductor elements 400 are arranged in the curved surface, the power semiconductor elements 400 are sterically formed, and the package is formed along the curved surface. Basic configuration and electrical connection are the same as the above embodiment 500.

In a case of the embodiment 900, the virtual cylinder C is illustrated by chain lines. The long sides of the elongated rectangular external connecting terminals (410B and 415), which are configured to the three power semiconductor elements 400, are arranged in parallel to a main axis S along the side surface of the virtual cylinder C.

Further, in the power semiconductor elements 400 as shown in FIG. 9, a surface (a heat dissipation surface) of the metal plate 410A which is exposed from the package 530 faces an outer side surface of the virtual cylinder C. However, an arranging method of the three power semiconductor elements 400 along the side surface of the virtual cylinder C is not limited to the above one. Then, a surface which is an opposite surface of the heat dissipation one on the metal plate 410A which is exposed from the package 530 may face the outer side surface of the virtual cylinder C, or the power semiconductor elements 400 are disposed on an inner side surface of the virtual cylinder C and the heat dissipation surface on the metal plate 410A which is exposed from the package 530 may face the inner side surface of the virtual cylinder C, or the power semiconductor elements 400 are disposed on the inner side surface of the virtual cylinder C and the opposite surface of the heat dissipation one on the metal plate 410A which is exposed from the package 530 may face the inner side surface of the virtual cylinder C.

The above configuration is adopted in the embodiment 900 of the present invention. For example, in a case that a shape of a casing of the control unit 100 in the electric power steering apparatus is a curve surface comprising a cylinder shape or the like which is fit into a configuration of the motor 20, it is possible to efficiently use the side surface of the casing of the control unit 100 or the like as the heat sink and so on by arranging the power semiconductor modules along the cylindrical side surface of the casing of the control unit 100 and the motor 20.

Figure 10A:
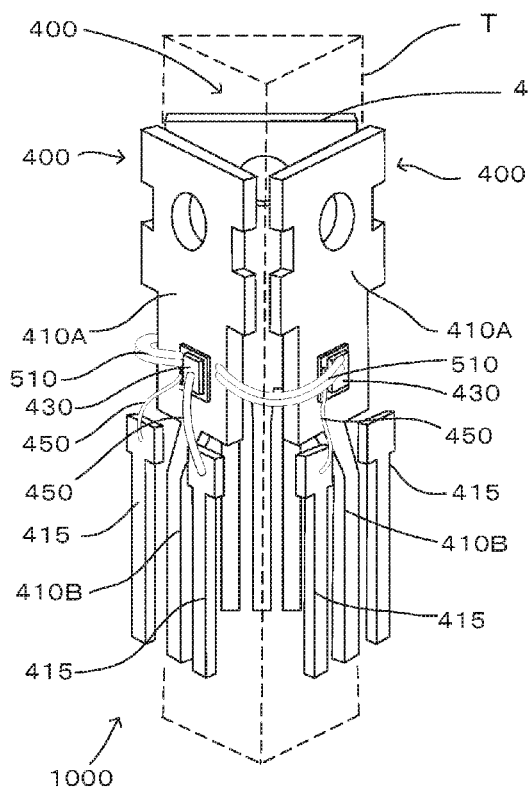
FIG. 10A is a perspective view illustrating yet another example of the power semiconductor module of the present invention which does not include the package portion.
Figure 10B:
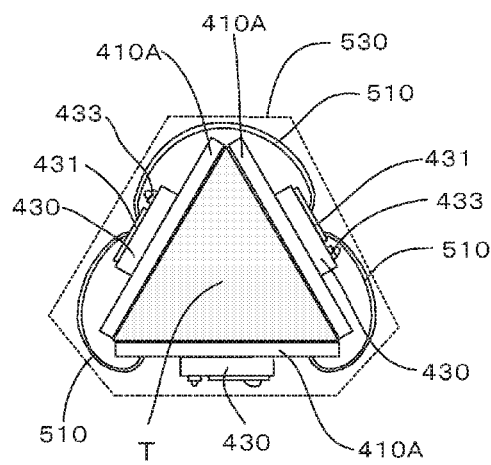
FIG. 10B is a top view of the example of FIG. 10A.
Figure 10C:
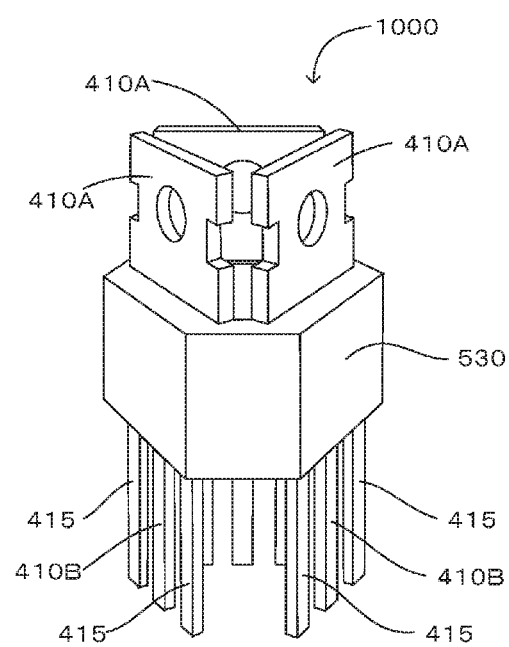
FIG. 10C is a perspective view illustrating an overall structure of the example of FIG. 10A.

FIG. 10A to FIG. 10C show an example that the three power semiconductor elements 400 are arranged in parallel along respective side surface of a column which is constituted by a virtual polygon. Here, especially, an example of an embodiment 1000 in a case of a triangular column T which the virtual polygon is a triangle is illustrated.

FIG. 10A is a perspective view illustrating a mutual connecting state in a case that the power semiconductor elements 400 before being packaged by the electrical insulating resin 530 are arranged in parallel in the above embodiment 900, FIG. 10B is a top view of the example of FIG. 10A, and FIG. 10C is a perspective view after being packaged by the above resin.

As shown in FIG. 10A, in the embodiment 1000, the power semiconductor elements 400 are arranged along the three side surface of the virtual triangular column T which is illustrated by chain lines, and the heat dissipation surfaces on the metal plates 410 face toward the outer side surface of the virtual triangular column T.

Thus, the above sterically arrangement is more miniaturized than arranging the power semiconductor elements 400 in a flat surface.

In the above embodiment 1000, because the power semiconductor elements 400 are arranged in parallel along the respective side surface of column which is constituted by a virtual polygon, the power semiconductor elements 400 are sterically formed, and the package is formed along the side surface of the column. Basic configuration and electrical connection are basically the same as the embodiment 500 as shown in FIG. 5A to FIG. 5D.

However, in a case of the embodiment 1000, since the three power semiconductor elements 400 are arranged in parallel to the side surfaces of the virtual triangular column T, the three power semiconductor elements 400 have a mutually adjacent relationship.

Therefore, as shown in FIG. 10B, in maintaining an electrical connecting relationship shown in FIG. 5B, the source electrodes of the power semiconductors 430, which are corresponding to the left and right ones and are disposed on the power semiconductor elements 400 in a view, are directly connected via the clips 510 or the wirings 450. Then, it is possible to decrease the wiring resistance. In FIG. 10B, a frame which is shown by a dotted line denotes a profile of the package by the electrical insulating resin 530.

In the above power semiconductor elements 400 as shown in FIG. 10A to FIG. 10C, a surface (a heat dissipation surface) of the metal plate 410A which is exposed from the package 530 faces toward an outer side surface of the virtual triangular column T.

However, an arranging method of the three power semiconductor elements 400 along the side surface of the virtual triangular column T is not limited to the above one.

Thus, a surface which is an opposite surface of the heat dissipation one on the metal plate 410A which is exposed from the package 530 may face toward the outer side surface of the virtual triangular column T, or the power semiconductor elements 400 are disposed on an inner side surface of the virtual triangular column T and the heat dissipation surface on the metal plate 410A which is exposed from the package 530 may face toward the inner side surface of the virtual triangular column T, or the power semiconductor elements 400 are disposed on the inner side surface of the virtual triangular column T and the opposite surface of the heat dissipation one on the metal plate 410A which is exposed from the package 530 may face toward the inner side surface of the virtual triangular column T.

By adopting the above structure in the above embodiment 1000 of the present invention, it is possible to further miniaturize the above power semiconductor module.

It is possible to heat-dissipate the power semiconductor module of the embodiment 1000 by providing the triangular heat sink interior of the power semiconductor modules in a case that the power semiconductor modules of the embodiment 1000 are attached to the substrate of the control unit of the electric power steering apparatus, and the heat dissipation surfaces of the power semiconductor modules face inwardly in the arrangement, or by providing the heat sinks outside of the profile of the triangular column shape in a case that the heat dissipation surfaces are disposed outwardly each other.

According to the power semiconductor module of the present invention, it is possible to provide a low cost and a high reliability power semiconductor module that is internal-connected to the needed power semiconductor elements, integrates the power semiconductor modules, and achieves a miniaturization, an improvement in the heat dissipation, a decreasing of an internal resistance and so on by using the plural power semiconductor elements which can be composed of general purpose components.

The above embodiments show examples of the configurations of the present invention. Then, the scope of the present invention is not limited to the configurations showing the above embodiments. It is possible to perform various modifications within the range of a gist of the present invention.

EXPLANATION OF REFERENCE NUMERALS 1 handle
2 column shaft (steering shaft, handle shaft)
3 reduction mechanism
4a 4b universal joint
5 pinion rack mechanism
6a 6b tie rod
7a 7b hub unit
8L 8R steered wheel
10 torque sensor
11 ignition key
12 vehicle speed sensor
13 battery
14 steering angle sensor
20 electric motor
23 motor relay
100 control unit (ECU)
101 current command value calculating section
104 PI-control section
105 PWM-control section
106 inverter
110 compensation signal generating section
400 power semiconductor element
410 metal plate
410A metal plate portion
410B external connecting terminal section
410C bore
415 external connecting terminal
430 power semiconductor bare chip
431 source electrode
433 gate electrode
435 drain electrode
450 wiring
500 700 900 1000 embodiment
510 metal connector (clip)
530 electrical insulating resin (package)
C virtual cylinder
S main axis of virtual cylinder
T virtual triangular column

The invention claimed is:

1. A power semiconductor module that comprises plural arrangements of power semiconductor elements comprising a power semiconductor bare chip which one electrode portion thereof is connected to a metal plate which at least one external connecting terminal is formed and other external connecting terminals which are electrically connected to other electrode portions of said power semiconductor bare chip, and that is formed by being contained in a same package, comprises:

wherein said plural power semiconductor elements are basically same outline, electrodes of said bare chip of said plural power semiconductor elements are mutually connected between said plural power semiconductor elements with a metal connector or a wiring, said package is a resin mold package that seals said plural power semiconductor elements with an electrical insulating resin, said power semiconductor elements are same as those of a power semiconductor package inside of a single power semiconductor bare chip and have an external connecting terminal which is not electrically connected by said mutual connection in sealing said resin mold package, said power semiconductor bare chip is a bare chip of a field effect transistor, a drain electrode of said bare chip is joined to a metal plate formed to said one external connecting terminal, a gate electrode and a source electrode of said bare chip are provided with a spaced side from said one external connecting terminal against said drain electrode, and portions of said gate electrode and said source electrode are mutually connected between said power semiconductor elements with said metal connector or said wiring, said metal plate has an exposed portion which is exposed from said package inside to an exterior, and said exposed portion is connectable to a heat dissipater which is disposed on an exterior.

2. The power semiconductor module according to claim 1, wherein said two power semiconductor elements are arranged in parallel, a source electrode of a bare chip of a first power semiconductor element is electrically connected to a source electrode of a bare chip of a second power semiconductor element with two metal connectors, and first and second power semiconductor elements are functionally integrated.

3. The power semiconductor module according to claim 2, wherein said one external connecting terminal and said other external connecting terminals are mutually arranged in parallel.

4. The power semiconductor module according to claim 2, wherein said arrangements are arranged in parallel to said power semiconductor elements on a flat surface.

5. The power semiconductor module according to claim 2, wherein said arrangements are arranged in parallel to said power semiconductor elements along a virtual curved surface.

6. The power semiconductor module according to claim 5, wherein said virtual curved surface is a side surface of a cylinder, and said external connecting terminals are parallel to a direction of a main axis of said cylinder.

7. An electric power steering apparatus that uses the power semiconductor module according to claim 2, comprises:

said one power semiconductor module, one module comprising said two power semiconductor elements to control a power supply in said electric power steering apparatus, and said two power semiconductor elements being contained in a same package, wherein said four power semiconductor modules are formed in a curved shape along a side surface shape of a control unit of said electric power steering apparatus or said three-phase brushless motor, and are disposed on a side surface of a control unit of said electric power steering apparatus or said three-phase brushless motor.

8. The power semiconductor module according to claim 1, wherein said three power semiconductor elements are arranged in parallel, a source electrode of a bare chip of a first power semiconductor element is electrically connected to a drain electrode of a bare chip of a second power semiconductor element through a metal plate portion of said second power semiconductor element with two metal connectors, said metal plate portion of said second power semiconductor element is electrically connected to a source electrode of a bare chip of a third power semiconductor element with other two metal connectors, and said first, second, and third power semiconductor elements are functionally integrated.

9. The power semiconductor module according to claim 8, wherein said one external connecting terminal and said other external connecting terminals are mutually arranged in parallel.

10. The power semiconductor module according to claim 8, wherein said arrangements are arranged in parallel to said power semiconductor elements on a flat surface.

11. The power semiconductor module according to claim 8, wherein said arrangements are arranged in parallel to said power semiconductor elements along a virtual curved surface.

12. The power semiconductor module according to Claim 11, wherein said virtual curved surface is a side surface of a cylinder, and said external connecting terminals are parallel to a direction of a main axis of said cylinder.

13. An electric power steering apparatus that uses the power semiconductor module according to Claim 8, comprises:

said three power semiconductor modules, each module comprising said three power semiconductor elements to control each one phase in a three-phase brushless motor which is used in said electric power steering apparatus, and three elements being contained in a same package.

14. The power semiconductor module according to claim 1, wherein said one external connecting terminal and said other external connecting terminals are mutually arranged in parallel.

15. The power semiconductor module according to claim 1, wherein said arrangements are arranged in parallel to said power semiconductor elements on a flat surface.

16. The power semiconductor module according to claim 1, wherein said arrangements are arranged in parallel to said power semiconductor elements along a virtual curved surface.

17. The power semiconductor module according to claim 16, wherein said virtual curved surface is a side surface of a cylinder, and said external connecting terminals are parallel to a direction of a main axis of said cylinder.

18. The power semiconductor module according to claim 1, wherein a material of said metal plate is copper or aluminum.

19. An electric power steering apparatus that uses the power semiconductor module according to claim 1.

20. A power semiconductor module that comprises plural arrangements of power semiconductor elements comprising a power semiconductor bare chip which one electrode portion thereof is connected to a metal plate which at least one external connecting terminal is formed and other external connecting terminals which are electrically connected to other electrode portions of said power semiconductor bare chip, and that is formed by being contained in a same package, comprises:

wherein said plural power semiconductor elements are basically same outline, electrodes of said bare chip of said plural power semiconductor elements are mutually connected between said plural power semiconductor elements with a metal connector or a wiring, said package is a resin mold package that seals said plural power semiconductor elements with an electrical insulating resin, said power semiconductor elements are same as those of a power semiconductor package inside of a single power semiconductor bare chip and have an external connecting terminal which is not electrically connected by said mutual connection in sealing said resin mold package, said power semiconductor bare chip is a bare chip of a field effect transistor, a drain electrode of said bare chip is joined to a metal plate formed to said one external connecting terminal, a gate electrode and a source electrode of said bare chip are provided with a spaced side from said one external connecting terminal against said drain electrode, and portions of said gate electrode and said source electrode are mutually connected between said power semiconductor elements with said metal connector or said wiring, three power semiconductor elements in said plural power semiconductor elements are arranged in parallel, a source electrode of a bare chip of a first power semiconductor element is electrically connected to a drain electrode of a bare chip of a second power semiconductor element through a metal plate portion of said second power semiconductor element with two metal connectors, said metal plate portion of said second power semiconductor element is electrically connected to a source electrode of a bare chip of a third power semiconductor element with other two metal connectors, and said first, second, and third power semiconductor elements are functionally integrated, said plural arrangements of said plural power semiconductor elements are arranged in parallel along respective side surfaces of a virtual triangular column, a heat sink is disposed on an interior of said virtual triangular column, and said external connecting terminals are parallel to a direction of a main axis of said triangular column.

21. A power semiconductor module that comprises plural arrangements of power semiconductor elements comprising a power semiconductor bare chip which one electrode portion thereof is connected to a metal plate which at least one external connecting terminal is formed and other external connecting terminals which are electrically connected to other electrode portions of said power semiconductor bare chip, and that is formed by being contained in a same package, comprises:

wherein said plural power semiconductor elements are basically same outline, electrodes of said bare chip of said plural power semiconductor elements are mutually connected between said plural power semiconductor elements with a metal connector or a wiring, said package is a resin mold package that seals said plural power semiconductor elements with an electrical insulating resin, said power semiconductor elements are same as those of a power semiconductor package inside of a single power semiconductor bare chip and have an external connecting terminal which is not electrically connected by said mutual connection in sealing said resin mold package, said power semiconductor bare chip is a bare chip of a field effect transistor, a drain electrode of said bare chip is joined to a metal plate formed to said one external connecting terminal, a gate electrode and a source electrode of said bare chip are provided with a spaced side from said one external connecting terminal against said drain electrode, and portions of said gate electrode and said source electrode are mutually connected between said power semiconductor elements with said metal connector or said wiring, said one external connecting terminal and said other external connecting terminals are mutually arranged in parallel, said plural arrangements of said plural power semiconductor elements are arranged in parallel along respective side surfaces of a virtual triangular column, a heat sink is disposed on an interior of said virtual triangular column, and said external connecting terminals are parallel to a direction of a main axis of said triangular column.

* * * * *